(12) United States Patent
Ariyama

(10) Patent No.: US 7,915,964 B2
(45) Date of Patent: Mar. 29, 2011

(54) VARIABLE FREQUENCY OSCILLATING CIRCUIT

(75) Inventor: Minoru Ariyama, Chiba (JP)

(73) Assignee: Seiko Instruments Inc. (JP)

( * ) Notice: Subject to any disclaimer, the term of this patent is extended or adjusted under 35 U.S.C. 154(b) by 69 days.

(21) Appl. No.: 12/229,805

(22) Filed: Aug. 27, 2008

(65) Prior Publication Data

US 2009/0058542 A1    Mar. 5, 2009

(30) Foreign Application Priority Data

Aug. 28, 2007  (JP) ................................. 2007-220966

(51) Int. Cl.
*H03K 3/03*    (2006.01)
(52) U.S. Cl. .......................................... 331/57; 331/173
(58) Field of Classification Search .................... 331/57, 331/16, 34, 172–174, 177 R, 185
See application file for complete search history.

(56) References Cited

U.S. PATENT DOCUMENTS

| | | | |
|---|---|---|---|
| 5,841,707 A * | 11/1998 | Cline et al. ..................... | 365/194 |
| 5,920,226 A * | 7/1999 | Mimura ......................... | 327/537 |
| 6,154,100 A * | 11/2000 | Okamoto ........................ | 331/57 |
| 6,414,522 B1 * | 7/2002 | Nguyen et al. ................. | 327/101 |
| 6,809,605 B2 * | 10/2004 | Ogawa et al. ................... | 331/173 |
| 7,129,796 B2 * | 10/2006 | Goto .............................. | 331/57 |
| 7,255,476 B2 * | 8/2007 | Franch et al. .................. | 374/178 |
| 7,449,965 B2 * | 11/2008 | Jang ............................... | 331/57 |

OTHER PUBLICATIONS

Patent Abstracts of Japan, publication No. 10-190414, publication date Jul. 21, 1998.

* cited by examiner

*Primary Examiner* — Robert Pascal
*Assistant Examiner* — Levi Gannon
(74) *Attorney, Agent, or Firm* — Adams & Wilks

(57) ABSTRACT

A variable frequency oscillating circuit has an oscillating circuit that undergoes an oscillation operation. The oscillating circuit has at least one inverter and at least one capacitor forming a circuit in a ring oscillator configuration. A current circuit outputs a current based on a frequency control signal controlling a frequency of a clock signal output from the oscillating circuit. A pulse generating circuit generates a pulse when the frequency control signal is switched from low to high and from high to low. The oscillating circuit stops an oscillation operation by stopping a charge/discharge operation of the at least one capacitor when the pulse is generated by the pulse generating circuit.

10 Claims, 5 Drawing Sheets

VARIABLE FREQUENCY OSCILLATING CIRCUIT

BACKGROUND OF THE INVENTION

1. Field of the Invention

The present invention relates to a variable frequency oscillating circuit.

2. Description of the Related Art

In semiconductor devices, an oscillating circuit is incorporated in some cases.

In this case, if a plurality of clock signals having different frequencies are required, there may be provided a plurality of oscillating circuits, and a predetermined clock signal is used among the clock signals output from the respective oscillating circuits.

However, provision of the plurality of oscillating circuits leads to an increase in its circuit size.

To deal with this problem, a variable frequency oscillating circuit as shown in FIG. 10 has been proposed. In this circuit, a ring oscillator 12 includes an odd number of inverters 11-2 to 11-n, and transistors 14 and 15 having different threshold voltages and a switch 17 are provided between a power supply line 13 of the ring oscillator 12 and a power supply 21. When a controller 22 is controlled to switch a connection destination of the switch 17, a power supply voltage of the power supply 21 is dropped by the transistor 14 or the transistor 15, and then is supplied to the ring oscillator 12 (for example, see JP 10-190414 A).

With such a configuration, one ring oscillator is used, and the power supply voltage supplied to the ring oscillator 12 is changed to change a frequency of a clock signal output from the ring oscillator 12, with the result that a plurality of clock signals having different frequencies can be generated. Accordingly, a circuit size is not increased.

However, in the technology disclosed in JP 10-190414 A, when the connection destination of the switch 17 is switched, an unintended power supply voltage may be supplied to the ring oscillator 12 to generate a clock signal having an unintended frequency. As a result, a semiconductor device may malfunction.

SUMMARY OF THE INVENTION

The present invention has been made in view of the aforementioned problem, and an object thereof is to provide a variable frequency oscillating circuit which has a small circuit size and is unlikely to cause a semiconductor device to malfunction.

In order to solve the aforementioned problem, the present invention provides a variable frequency oscillating circuit, including:

an oscillating circuit that undergoes an oscillation operation, the oscillating circuit having at least one inverter and at least one capacitor forming a circuit in a ring oscillator configuration;

a current circuit for outputting a first current based on a frequency control signal for controlling a frequency of a clock signal output from the oscillating circuit; and a pulse generating circuit for generating a pulse when the frequency control signal is switched from low to high and from high to low, in which the oscillating circuit:

outputs a second current based on the first current;

stops the oscillating of the second current when the pulse is generated by the pulse generating circuit; and oscillates the second current, based on the second current, at a frequency based on the frequency control signal when the pulse is not generated by the pulse generating circuit.

In the present invention, because one oscillating circuit is used, the circuit size is not increased.

Further, in the present invention, when the frequency control signal is switched, the first current and the second current are each switched, and ringing is generated in the first current and the second current, the pulse is generated by the pulse generating circuit during the ringing, and the oscillating circuit stops a regular oscillation due to the pulse thus generated, with the result that a clock signal having an unintended frequency is not generated. Accordingly, the semiconductor device does not malfunction.

DETAILED DESCRIPTION OF THE PREFERRED EMBODIMENT

Hereinafter, an embodiment of the present invention is described with reference to the drawings.

Figure 1:
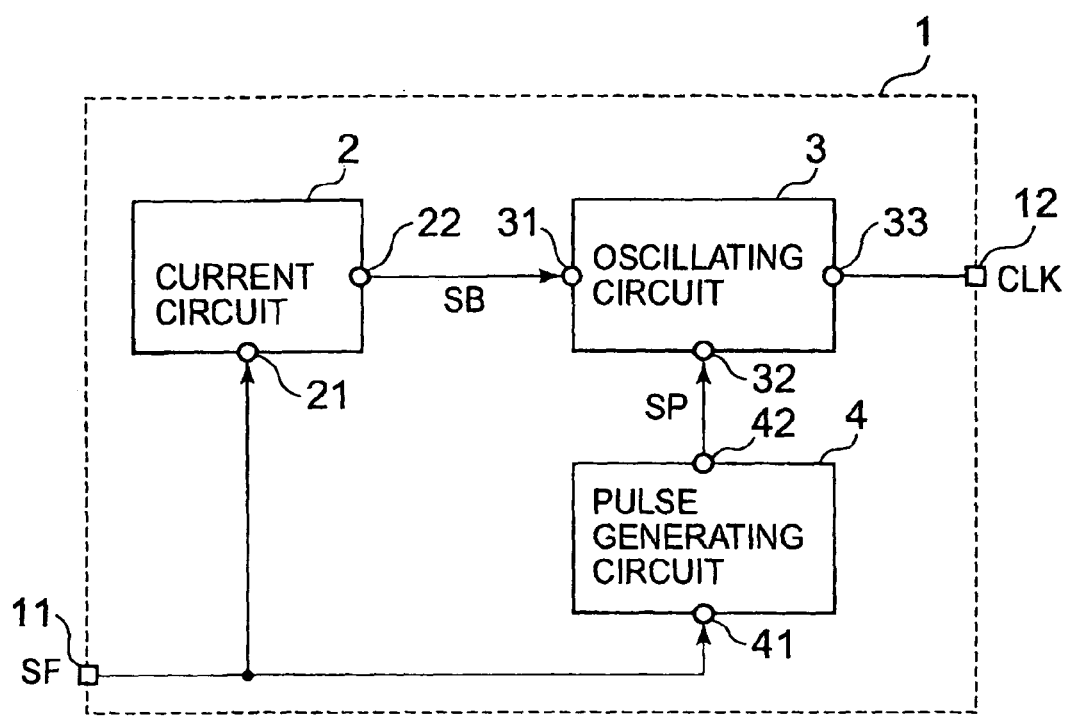
FIG. 1 is a diagram showing an outline of a variable frequency oscillating circuit.

First, a schematic configuration of a variable frequency oscillating circuit is described. FIG. 1 is a diagram showing an outline of the variable frequency oscillating circuit.

A variable frequency oscillating circuit 1 includes a current circuit 2, an oscillating circuit 3, and a pulse generating circuit 4. In addition, the variable frequency oscillating circuit 1 includes an input terminal 11 and an output terminal 12.

The input terminal 11 of the variable frequency oscillating circuit 1 is connected to an input terminal 21 of the current circuit 2 and an input terminal 41 of the pulse generating circuit 4. An output terminal 22 of the current circuit 2 is connected to an input terminal 31 of the oscillating circuit 3. An output terminal 42 of the pulse generating circuit 4 is connected to an input terminal 32 of the oscillating circuit 32. An output terminal 33 of the oscillating circuit 3 is connected to the output terminal 12 of the variable frequency oscillating circuit 1.

Next, a schematic operation of the variable frequency oscillating circuit 1 is described.

A frequency control signal SF for controlling a frequency of a clock signal CLK output from the oscillating circuit 3 is input to the input terminal 11, and then is input to the input terminal 21. Based on the frequency control signal SF, the current circuit 2 outputs a current. The current circuit 2 outputs a current control signal SB to the oscillating circuit 3 to control a current of the oscillating circuit 3 so that a current based on the current of the current circuit 2, which is based on the frequency control signal SF, outputs through the oscillating circuit 3. In addition, the frequency control signal SF is input to the input terminal 41. When the frequency control signal SF is switched from low to high and from high to low, the pulse generating circuit 4 outputs a high pulse signal SP to the oscillating circuit 3 (the pulse generating circuit 4 generates a pulse to output the generated pulse to the oscillating circuit 3). When the pulse signal SP becomes high and is input to the oscillating circuit 3, that is, when the pulse is generated by the pulse generating circuit 4, the oscillating circuit 3 does not oscillate. On the other hand, when the pulse signal SP becomes low and is input to the oscillating circuit 3, that is, when the pulse is not generated by the pulse generating circuit 4, the oscillating circuit 3 oscillates, based on a current of the oscillating circuit 3, at a frequency based on the frequency control signal SF. The current of the oscillating circuit 3 is based on the current of the current circuit 2, which is based on the frequency control signal SF.

Figure 2:
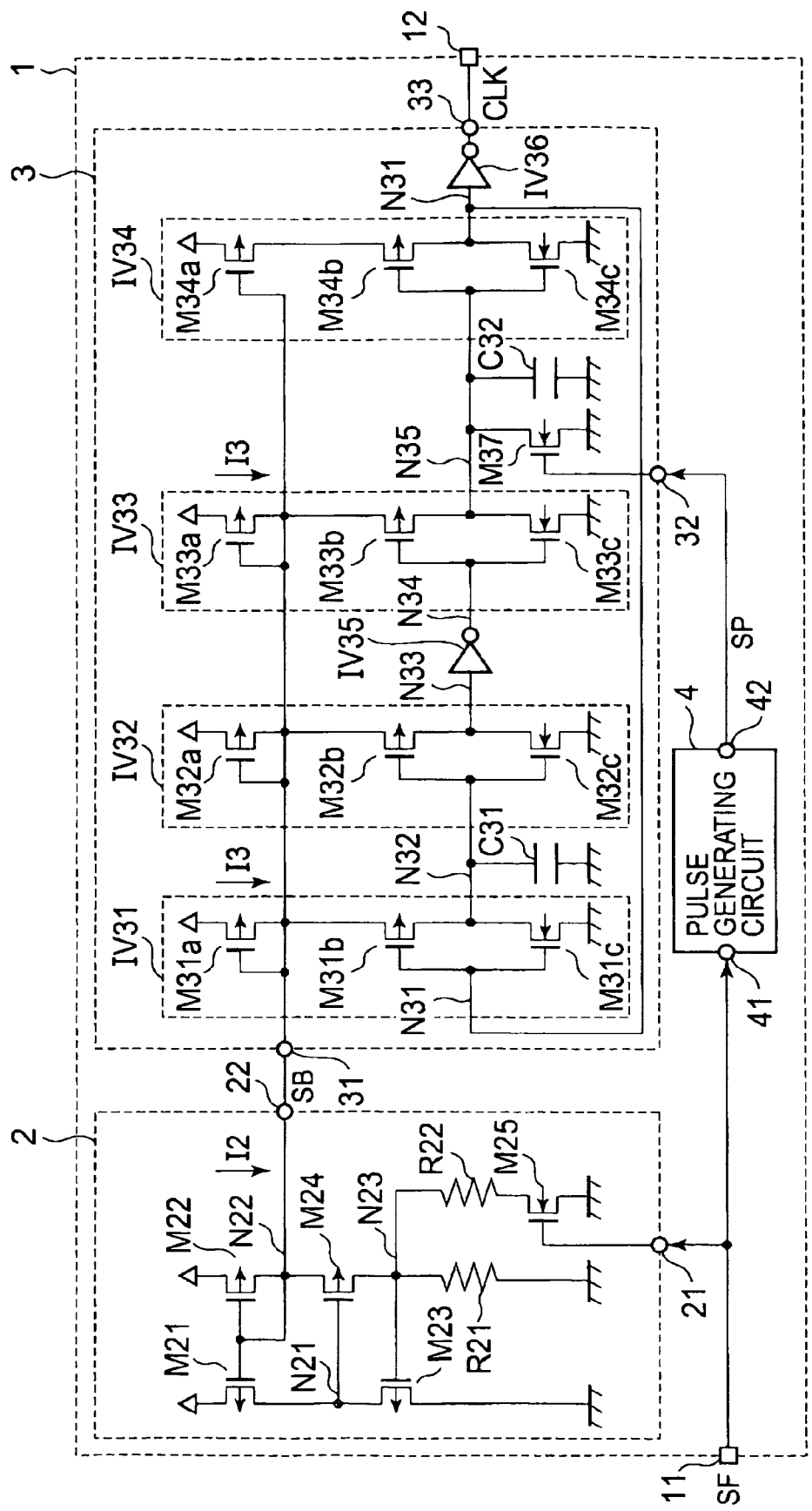
FIG. 2 is a diagram showing a current circuit and an oscillating circuit.
Figure 6:
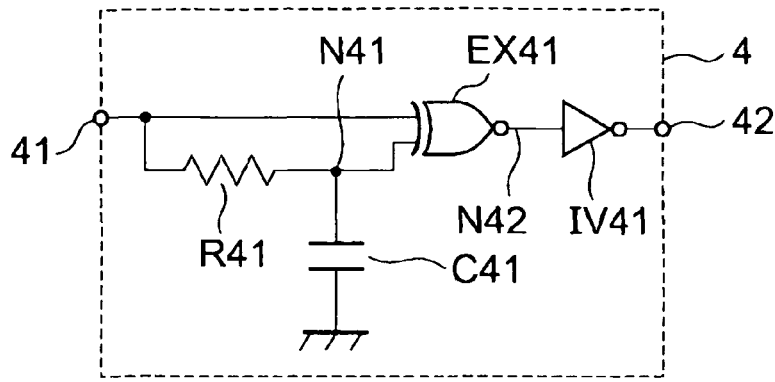
FIG. 6 is a diagram showing a pulse generating circuit.

Next, a specific configuration of the variable frequency oscillating circuit 1 is described. FIG. 2 is a diagram showing a current circuit and an oscillating circuit. FIG. 6 is a diagram showing a pulse generating circuit.

The current circuit 2 includes transistors M21 to M25, resistors R21 and R22, and connection points N21 to N23.

A gate of the transistor M21 is connected to the connection point N22, a source thereof is connected to a power supply terminal, and a drain thereof is connected to the connection point N21. The connection point N22 is connected to the output terminal 22. A gate of the transistor M22 is connected to the connection point N22, a source thereof is connected to a power supply terminal, and a drain thereof is also connected to the connection point N22. A gate of the transistor M23 is connected to the connection point N23, a source thereof is connected to a ground terminal, and a drain thereof is connected to the connection point N21. A gate of the transistor M24 is connected to the connection point N21, a source thereof is connected to the connection point 23, and a drain thereof is connected to the connection point N22. One end of the resistor R21 is connected to the connection point N23, and the other end thereof is connected to the ground terminal. One end of the resistor R22 is connected to the connection point N23, and the other end thereof is connected to a drain of the transistor 25. A gate of the transistor M25 is connected to the input terminal 21, and a source thereof is connected to the ground terminal.

The oscillating circuit 3 includes current inverters IV31 to IV34, inverters IV35 and IV36, a transistor M37, capacitors C31 and C32, and connection points N31 to N35.

The current inverters IV31 to IV34 pass a current based on the current control signal SB. An input terminal of the current inverter IV31 is connected to the connection point N31, and an output terminal thereof is connected to the connection point N32. An input terminal of the current inverter IV32 is connected to the connection point N32, and an output terminal thereof is connected to the connection point N33. An input terminal of the inverter IV35 is connected to the connection point N33, and an output terminal thereof is connected to the connection point N34. An input terminal of the current inverter IV33 is connected to the connection point N34, and an output terminal thereof is connected to the connection point N35. An input terminal of the current inverter IV34 is connected to the connection point N35, and an output terminal thereof is connected to the connection point N31. An input terminal of the inverter IV36 is connected to the connection point N31, and an output terminal thereof is connected to the output terminal 33. One end of the capacitor C31 is connected to the connection point N32, and the other end thereof is connected to the ground terminal. One end of the capacitor C32 is connected to the connection point N35, and the other end thereof is connected to the ground terminal. A gate of the transistor M37 is connected to the input terminal 32, a source thereof is connected to the ground terminal, and a drain thereof is connected to the connection point N35. In other words, the oscillating circuit 3 is a circuit having a ring oscillator configuration.

The oscillating circuit 3 oscillates at a frequency determined by capacitance values of the capacitors C31 and C32, a current value of a current I3 charging the capacitors C31 and C32, and an input voltage (turnover voltage) when output voltages of the current inverter IV32, which is connected to a next stage of the capacitor C31, and the current inverter IV34, which is connected to a next stage of the capacitor C32, are reversed. Further, the transistor M37 has a sufficiently larger driving ability than transistors M33a and M33b. Specifically, a circuit of the transistor M37 is designed to have a large enough driving ability so that a voltage VN35 of the connection point N35 is substantially low even when the transistor M37 and the transistors M33a and M33b are turned on and a through current flows.

The current inverter IV31 includes transistors M31a to M31c.

A gate of the transistor M31a is connected to the input terminal 31, a source thereof is connected to a power supply terminal, and a drain thereof is connected to a source of the transistor M31b. A gate of the transistor M31b is connected to the connection point N31, and a drain thereof is connected to the connection point N32. A gate of the transistor M31c is connected to the connection point N31, a source thereof is connected to the ground terminal, and a drain thereof is connected to the connection point N32.

The current inverter IV32 includes transistors M32a to M32c.

A gate of the transistor M32a is connected to the input terminal 31, a source thereof is connected to a power supply terminal, and a drain thereof is connected to a source of the transistor M32b. A gate of the transistor M32b is connected to the connection point N32, and a drain thereof is connected to the connection point N33. A gate of the transistor M32c is connected to the connection point N32, a source thereof is connected to the ground terminal, and a drain thereof is connected to the connection point N33.

The current inverter IV33 includes transistors M33a to M33c.

A gate of the transistor M33a is connected to the input terminal 31, a source thereof is connected to a power supply terminal, and a drain thereof is connected to a source of the transistor M33b. A gate of the transistor M33b is connected to the connection point N34, and a drain thereof is connected to the connection point N35. A gate of the transistor M33c is connected to the connection point N34, a source thereof is connected to the ground terminal, and a drain thereof is connected to the connection point N35.

The current inverter IV34 includes transistors M34a to M34c.

A gate of the transistor M34a is connected to the input terminal 31, a source thereof is connected to a power supply terminal, and a drain thereof is connected to a source of the transistor M34b. A gate of the transistor M34b is connected to the connection point N35, and a drain thereof is connected to the connection point N31. A gate of the transistor M34c is connected to the connection point N35, a source thereof is connected to the ground terminal, and a drain thereof is connected to the connection point N31.

The pulse generating circuit 4 includes an XOR circuit EX41, an inverter IN41, a resistor R41, a capacitor C41, and connection points N41 and N42.

One end of the resistor R41 is connected to the input terminal 41, and the other end thereof is connected to the connection point N41. One end of the capacitor C41 is connected to the connection point N41, and the other end thereof is connected to the ground terminal. A first input terminal of the XOR circuit EX41 is connected to the input terminal 41, a second input terminal thereof is connected to the connection point N41, and an output terminal thereof is connected to an input terminal of the inverter IV41. An output terminal of the inverter IV41 is connected to the output terminal 42.

A time when the pulse signal SP is output is determined by the resistor R41 and the capacitor C41.

Figure 3:
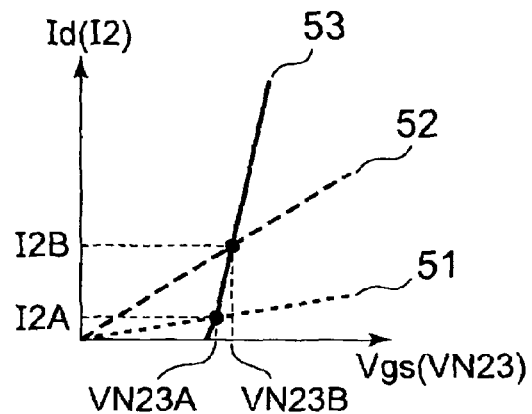
FIG. 3 is a graph showing currents of the current circuit.
Figure 4:
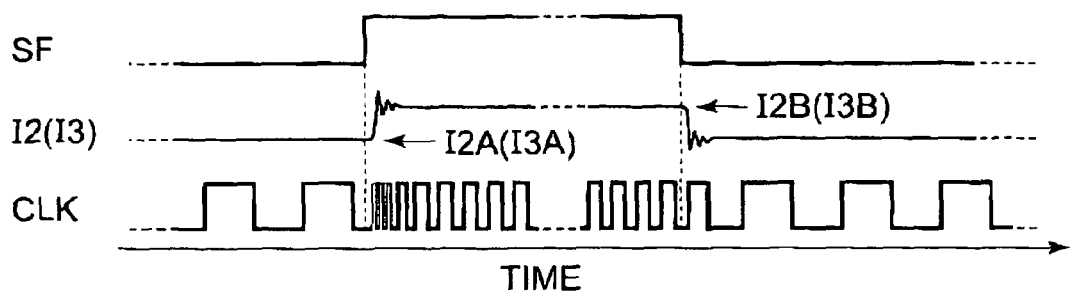
FIG. 4 is a chart showing a clock signal.
Figure 5:
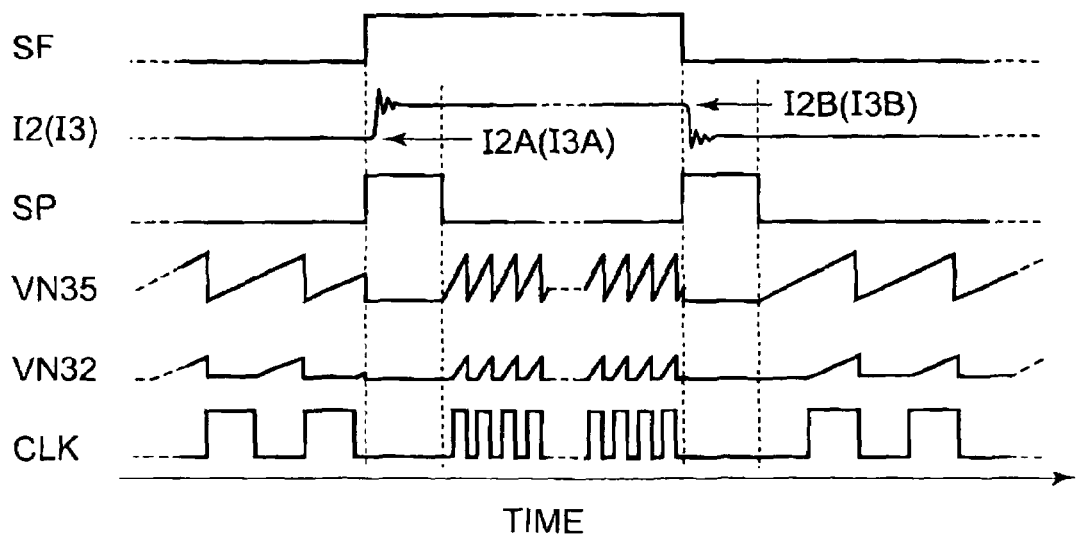
FIG. 5 is another chart showing the clock signal.
Figure 7:
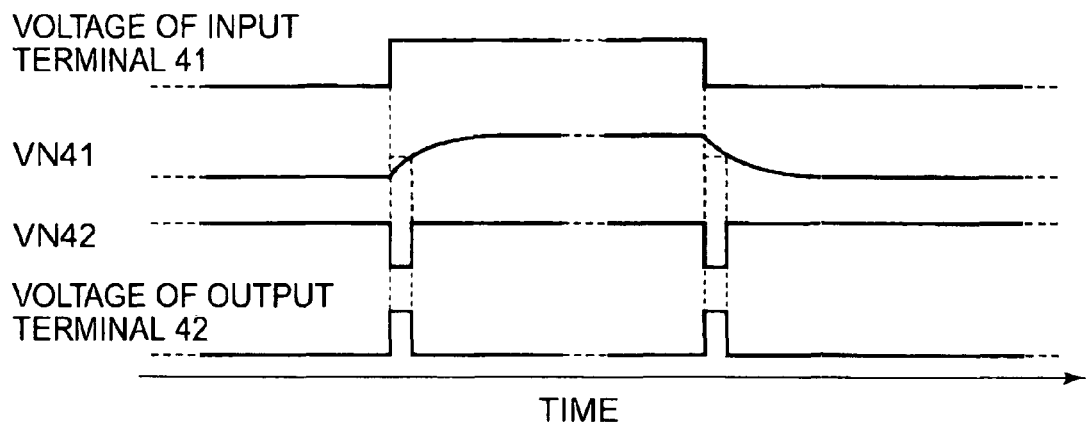
FIG. 7 is a chart showing a pulse signal.

Next, a specific operation of the variable frequency oscillating circuit 1 is described. FIG. 3 is a graph showing currents of the current circuit. FIG. 4 is a chart showing a clock signal. FIG. 5 is another chart showing the clock signal. FIG. 7 is a chart showing a pulse signal.

The frequency control signal SF is input to the input terminal 11, and then is input to the input terminal 21. When the frequency control signal SF is low (at a time of φA), the transistor M25 is turned off, and a resistance between the connection point N23 and the ground terminal is equal to a resistance of the resistor R21 (resistor RA). On the other hand, when the frequency control signal SF is high (at a time of φB), the transistor M25 is turned on, and a resistance between the connection point N23 and the ground terminal is equal to a parallel resistance (resistor RB) of the resistors R21 and R22 if an on-resistance of the transistor M25 is sufficiently smaller compared with the resistor R22. In other words, resistances of the resistors RA and RB are determined by the following equations:

$$RA = R21 \quad (1)$$

$$RB = (R21 \times R22)/(R21 + R22) \quad (2)$$

A current I2 flows through the transistor M22, the transistor M24, and the resistors R21 and R22 between the connection point N23 and the ground terminal. Based on the current I2 and the resistance between the connection point N23 and the ground terminal, a voltage VN23 is generated at the connection point N23. Then, if a current I2 at the time of φA is a current I2A, a voltage VN23 at the time of φA is a voltage VN23A, a current I2 at the time of φB is a current I2B, and a voltage VN23 at the time of φB is a voltage VN23B, the currents I2A and I2B are determined by the following equations:

$$I2A = VN23A/RA \quad (3)$$

$$I2B = VN23B/RB \quad (4)$$

In other words, the current circuit 2 outputs the current I2A or the current I2B based on the frequency control signal SF. If a current mirror ratio of the transistors M21 and M22 is 1:1, and channel length modulation of the transistors M21 and M22 is sufficiently small, currents of the transistors M21 to M24 become equal to each other. In FIG. 3, an abscissa represents a voltage Vgs (voltage VN23) between the gate and the source of the transistor M23, an ordinate represents a drain current Id (current I2) of the transistor M23, a line 51 represents a current I2 flowing through the resistor RA at the time of φA, a line 52 represents a current I2 flowing through the resistor RB at the time of φB, and a line 53 represents the drain current Id of the transistor M23. With reference to FIG. 3, at the time of φA, the transistor M23 operates at an intersection of the line 51 and the line 53, and the current Id of the transistor M23 is the current I2A. At the time of φB, the transistor M23 operates at an intersection of the line 52 and the line 53, and the current Id of the transistor M23 is the current I2B.

The transistor M22 and the transistors M31a to M34a are current mirror circuits, and a gate voltage (voltage VN22) of the transistor M22 of the current circuit 2 is input as the current control signal SB to the gates of the transistors M31a to M34a of the current inverters IV31 to IV34 of the oscillating circuit 3. Based on the current control signal SB, the transistors M31a to M34a pass the current I3, and the current I3 based on the current I2 of the current circuit 2, which is based on the frequency control signal SF, outputs through the oscillating circuit 3. In other words, the current circuit 2 outputs the current control signal SB to the oscillating circuit 3 and controls the current I3 of the oscillating circuit 3.

In this case, as shown in FIG. 4; when the frequency control signal SF is switched, the currents I2 and I3 are each switched, and ringing is generated in the currents I2 and I3, a clock signal CLK having an unintended frequency is output during the ringing. As a way to deal with this problem, in the present invention, as shown in FIG. 5, when ringing is generated in the currents I2 and I3, the pulse signal SP becomes high to be input to the oscillating circuit 3 during the ringing, and thus the clock signal CLK is fixed to low.

The frequency control signal SF is also input to the input terminal 41. After that, the frequency control signal SF is input to the first input terminal of the XOR circuit EX41. Besides, the frequency control signal SF is input to the second input terminal of the XOR circuit EX41 via a low pass filter formed of the resistor R41 and the capacitor 41. Thus, a state transition of a waveform of a voltage is delayed in the second input terminal compared with the first input terminal. Then, as shown in FIG. 7, until a predetermined period of time elapses from a time when the voltage of the input terminal 41 changes, that is, until a predetermined period of time elapses from a time when the voltage of the frequency control signal SF changes, a voltage VN42 of the output terminal of the XOR circuit EX41 becomes low, a voltage of the output terminal of the inverter IV41 becomes high, and the voltage of the output terminal 42 becomes also high. In other words, when the frequency control signal SF is switched from low to high and from high to low, as shown in FIG. 5 and FIG. 7, the pulse generating circuit 4 outputs the high pulse signal SP to the oscillating circuit 3 (the pulse generating circuit 4 generates a pulse to output the generated pulse to the oscillating circuit 3).

When the frequency control signal SF is switched, the currents I2 and I3 are each switched, and the pulse signal SP becomes high to be input to the oscillating circuit 3 when ringing is generated in the currents I2 and I3, that is, when the pulse is generated by the pulse generating circuit 4, the transistor M37 is turned on, and an electric charge stored in the capacitor C32 by the transistor M37 is discharged, with the result that the voltage VN35 of the connection point N35 is substantially equal to a ground voltage. Then, a voltage VN31 of the connection point N31 becomes high by means of the current inverter IV34. Since the transistor M31c is turned on, an electric charge stored in the capacitor C31 by the transistor M31c is discharged, and a voltage VN32 of the connection point N32 is also substantially equal to the ground voltage. In other words, when the pulse signal SP becomes high, the capacitors C31 and C32 are discharged, and charge/discharge operation of the oscillating circuit 3 is stopped. By means of the inverter IV36, the voltages of the output terminal 33 and the output terminal 12 become low, and the clock signal CLK also becomes low. Accordingly, the clock signal CLK is fixed to low, and thus the oscillating circuit 3 stops a regular oscillation. Note that a specific oscillation operation of the oscillating circuit 3 is described below.

At this time, the transistor M37 and the transistors M33a and M33b are turned on, and a through current flows. After that, when the pulse signal SP becomes low to be input to the oscillating circuit 3, that is, when the pulse is not generated by the pulse generating circuit 4, the transistor M37 is turned off, and the through current does not flow, with the result that the capacitor C32 can be charged by the current I3 of the transistors M33a and M33b. Therefore, based on the current I3 of the oscillating circuit 3, which is based on the current I2 of the current circuit 2, which is based on the frequency control signal SF, the oscillating circuit 3 starts the regular oscillation at a frequency based on the frequency control signal SF.

Next, a specific oscillation operation of the oscillating circuit 3 is described.

If C31=C32 and turnover voltages of the current inverter IV32 and the current inverter IV34 are V3, a frequency f of the clock signal CLK is determined by the following equation:

$$f=I3/(2 \times 31 \times V3) \qquad (5)$$

The current I2 is controlled by the frequency control signal SF and becomes the current I2A at the time of φA or the current I2B at the time of φB. The current I3 is controlled by the current I2 and becomes a current I3A at the time of φA or a current I3B at the time of φB. The frequency f of the clock signal CLK is controlled by the current I3 and becomes a frequency fA at the time of φA or a frequency fB at the time of φB. If the current I3 at the time of φA is the current I3A, the current I3 at the time of φB is the current I3B, the turnover voltages of the current inverter IV32 and the current inverter IV34 at the time of φA are V3A, and the turnover voltages of the current inverter IV32 and the current inverter IV34 at the time of φB are V3B, the frequencies fA and fB are determined by the following equations:

$$fA=I3A/(2 \times C31 \times V3A) \qquad (6)$$

$$fB=I3B/(2 \times C31 \times V3B) \qquad (7)$$

In this case, if a current mirror ratio of the transistor M22 and the transistors M31a to M34a is 1:1:1:1:1, and channel length modulation of the transistor M22 and the transistors M31a to M34a is sufficiently small, currents of the transistor M22 and the transistors M31a to M34a are equal to each other. Then, the following equations are established:

$$I3A=I2A \qquad (8)$$

$$I3B=I2B \qquad (9)$$

If driving abilities of the transistor M23, the transistor M32c, and the transistor M34c are equal to each other, the turnover voltages V3 of the current inverter IV32 and the current inverter IV34 are equal to the voltage VN32. Then, the following equations are established:

$$V3A=VN23A \qquad (10)$$

$$V3B=VN23B \qquad (11)$$

When Equations (8) to (11) are substituted into Equations (6) and (7), the following equations are established:

$$fA=I2A/(2 \times C31 \times VN23A) \qquad (12)$$

$$fB=I2B/(2 \times C31 \times VN23B) \qquad (13)$$

When Equations (3) and (4) are substituted into Equations (12) and (13), the following equations are established:

$$fA=1/(2 \times C31 \times RA) \qquad (14)$$

$$fB=1/(2 \times C31 \times RB) \qquad (15)$$

Then, a ratio between the frequencies fA and fB is as follows:

$$fB/fA=RA/RB \qquad (16)$$

When Equations (1) and (2) are substituted into Equation (16), the following equation is established:

$$fB/fA=1+(R21/R22) \qquad (17)$$

As a result, one oscillating circuit 3 is used as shown in FIG. 1 and FIG. 2, which does not lead to an increase in circuit size.

Further, as shown in FIG. 5, when the frequency control signal SF is switched, the currents I2 and I3 are each switched, and ringing is generated in the currents I2 and I3, the pulse signal SP becomes high to be input to the oscillating circuit 3 during the ringing (the pulse is generated by the pulse generating circuit 4), and the clock signal CLK output from the oscillating circuit 3 in response to the pulse signal SP is fixed to low, whereby the oscillating circuit 3 stops the regular oscillation. As a result, a clock signal having an unintended frequency is not generated, which prevents the semiconductor device from malfunctioning.

Equation (17) reveals that the ratio between the frequencies fA and fB is determined by the ratio between the resistance values of the resistors R21 and R22, and thus the ratio between the frequencies fA and fB is likely to be stabilized irrespective of temperature and process variations. Thus, the semiconductor device does not malfunction.

Note that, in the above description, the capacitors C31 and C32 are discharged in response to the pulse signal SP, but may be charged in response to the pulse signal SP depending on the ring oscillator configuration.

In the above description, the frequency control signal SF controls the transistor M25, the current circuit 2 outputs two types of currents, and the variable frequency oscillating circuit 1 generates two types of clock signals CLK. However, the frequency control signal SF may control a plurality of transistors (not shown), the current circuit 2 may pass three or more types of currents, and the variable frequency oscillating circuit 1 may generate three or more types of clock signals CLK.

Figure 9:
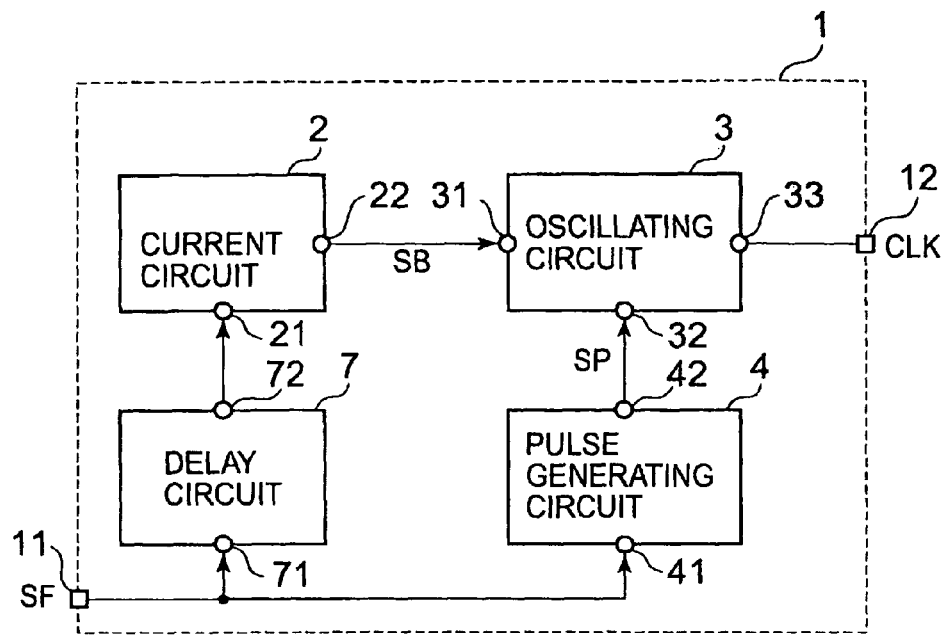
FIG. 9 is a diagram showing an outline of another variable frequency oscillating circuit.
Figure 10:
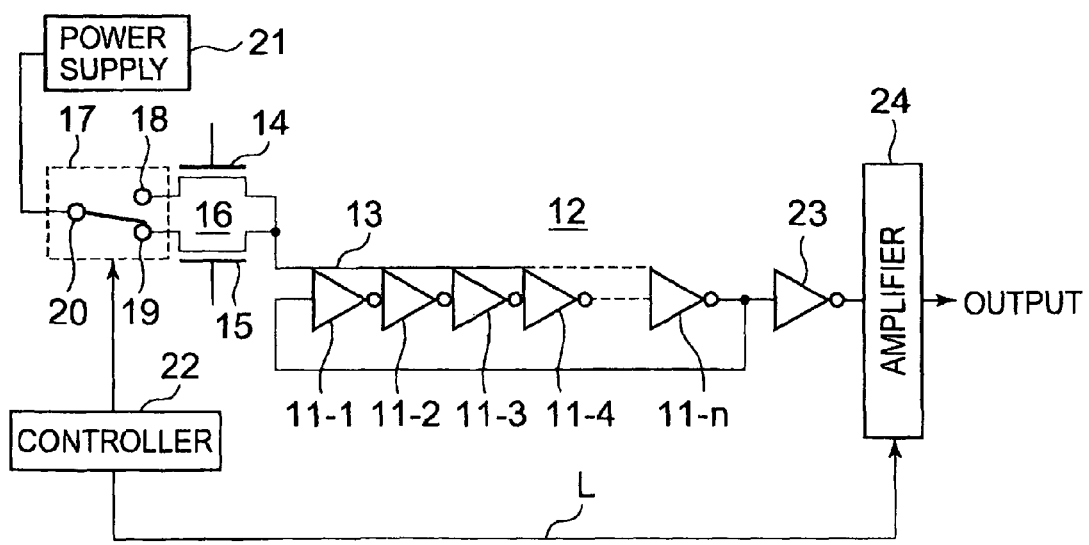
FIG. 10 is a diagram showing a conventional variable frequency oscillating circuit.

As shown in FIG. 9, a delay circuit 7 may be provided between the input terminal 11 and the input terminal 21. Then, for example, even when timing of the pulse signal SP of the pulse generating circuit 4 is delayed, switching timing of the currents I2 and I3 can be delayed proportionately.

Figure 8:
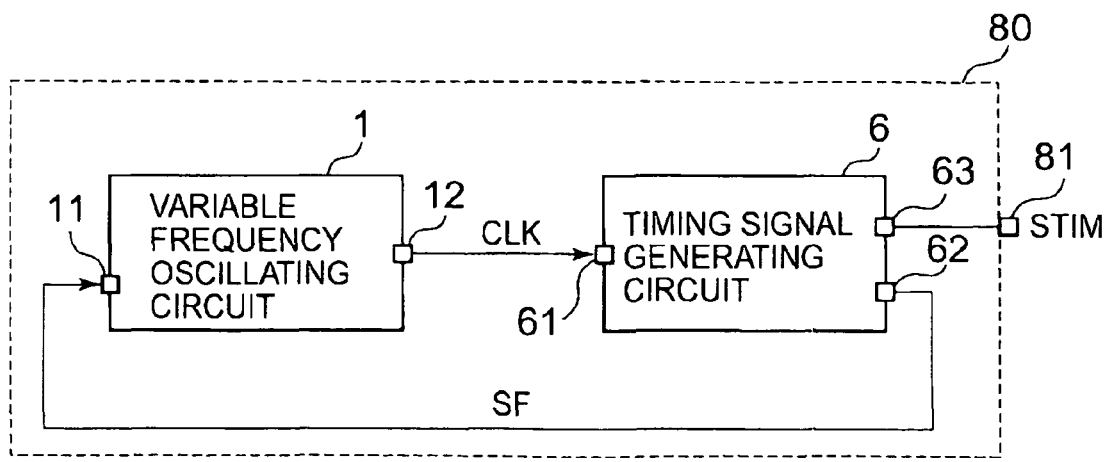
FIG. 8 is a diagram showing a control signal generating circuit.

The aforementioned variable frequency oscillating circuit 1 is used, in some cases, simultaneously with a timing signal generating circuit 6 which generates a timing signal for controlling operation timing of the respective circuits. FIG. 8 is a diagram showing a control signal generating circuit. A control signal generating circuit 80 includes the variable frequency oscillating circuit 1 and the timing signal generating circuit 6. An input terminal 61 of the timing signal generating circuit 6 is connected to the output terminal 12 of the variable frequency oscillating circuit 1, a first output terminal thereof is connected to an output terminal 81, and a second output terminal thereof is connected to the input terminal 11 of the variable frequency oscillating circuit 1. The variable frequency oscillating circuit 1 outputs a clock signal CLK devoid of a clock signal having an unintended frequency to the timing signal generating circuit 6. Accordingly, the timing signal generating circuit 6 does not malfunction. Based on the clock signal CLK, the timing signal generating circuit 6 outputs the timing signal for controlling operation timing of the respective circuits to an output terminal 63. The timing signal is output as a control signal to the respective circuits from the output terminal 81. The timing signal generating circuit 6 outputs a control signal for controlling the frequency of the clock signal CLK based on states of the respective circuits to an output terminal 62. The control signal is input to the variable frequency oscillating circuit 1.

When the transistor M37 is turned on in response to the frequency control signal SF, and the transistor M37 and the transistors M33*a* and M33*b* are turned on, the through current flows. However, there may be provided another transistor (not shown) for, for example, interrupting the through current so that the through current does not flow when other transistors other than the another transistor may be turned off even if the transistor M37 and the transistors M33*a* and M33*b* are turned on.

What is claimed is:

1. A variable frequency oscillating circuit, comprising:
   an oscillating circuit that undergoes an oscillation operation, the oscillating circuit having at least one inverter and at least one capacitor forming a circuit in a ring oscillator configuration;
   a current circuit that generates a current based on a frequency control signal controlling a frequency of a clock signal output from the oscillating circuit; and
   a one shot pulse generating circuit that generates a one shot pulse when the frequency control signal is switched from low to high and from high to low;
   wherein the oscillating circuit stops an oscillation operation by stopping a charge/discharge operation of the at least one capacitor when the one shot pulse is generated by the one shot pulse generating circuit.

2. A variable frequency oscillating circuit according to claim 1; wherein the at least one inverter and the at least one capacitor comprises a plurality of inverters and a plurality of capacitors, respectively.

3. A variable frequency oscillating circuit according to claim 1; further comprising a delay circuit connected between an input terminal of the current circuit and the input terminal of the variable frequency oscillating circuit.

4. A variable frequency oscillating circuit according to claim 1; wherein an output terminal of the current circuit is connected to a first input terminal of the oscillating circuit, an output terminal of the one shot pulse generating circuit is connected to a second input terminal of the oscillating circuit; and further comprising an output terminal connected to an output terminal of the oscillating circuit.

5. A variable frequency oscillating circuit according to claim 1; wherein the at least one capacitor of the oscillating circuit comprises a plurality of capacitors; and wherein the oscillating circuit is configured to undergo an oscillation operation at a frequency determined by capacitance values of the capacitors, a current value of a current charging the capacitors, and a turnover voltage corresponding to when output voltages inverters are reversed.

6. A variable frequency oscillating circuit according to claim 1; further comprising an input terminal and a delay circuit connected between the input terminal and an input terminal of the current circuit.

7. A variable frequency oscillating circuit comprising:
   an oscillating circuit that undergoes oscillation;
   an input terminal that inputs a frequency control signal for controlling a frequency of a clock signal output from the oscillating circuit;
   a current circuit that inputs the frequency control signal and that generates a current control signal that is output to the oscillating circuit based on the frequency control signal; and
   a one shot pulse generating circuit that inputs the frequency control signal and that outputs a one shot pulse signal to the oscillating circuit when the frequency control signal is switched from low to high and from high to low;
   wherein when the one shot pulse signal that is output to the oscillating circuit becomes high, the oscillating circuit does not oscillate; and
   wherein when the one shot pulse signal that is output to the oscillating circuit becomes low, the oscillating circuit oscillates based on a current of the oscillating circuit and at a frequency based on the frequency control signal.

8. A variable frequency oscillating circuit according to claim 7; wherein the oscillating circuit has at least one inverter and at least one capacitor forming a circuit in a ring oscillator configuration.

9. A variable frequency oscillating circuit according to claim 8; wherein the input terminal is connected to an input terminal of the current circuit and to an input terminal of the one shot pulse generating circuit; and further comprising an output terminal connected to an output terminal of the oscillating circuit; wherein an output terminal of the current circuit is connected to a first input terminal of the oscillating circuit, and an output terminal of the one shot pulse generating circuit is connected to a second input terminal of the oscillating circuit.

10. A variable frequency oscillating circuit according to claim 7; further comprising a delay circuit connected between the input terminal and an input terminal of the current circuit.

* * * * *